United States Patent [19]

Lucas et al.

[11] Patent Number: 4,591,808
[45] Date of Patent: May 27, 1986

[54] HIGH EFFICIENCY OSCILLATOR OUTPUT STAGE AND METHOD OF OPERATION

[75] Inventors: Charles H. Lucas, Newport Beach; Lanny L. Lewyn, Laguna Beach, both of Calif.

[73] Assignee: Hughes Aircraft Company, Los Angeles, Calif.

[21] Appl. No.: 686,365

[22] Filed: Dec. 26, 1984

[51] Int. Cl.$^4$ .............................................. H03B 5/32
[52] U.S. Cl. ................................ 331/116 FE; 331/158
[58] Field of Search .................. 331/116 FE, 158, 160

[56] References Cited

U.S. PATENT DOCUMENTS 4,459,565  7/1984  Leach ........................... 331/116 FE Primary Examiner—Eugene LaRoche
Assistant Examiner—G. Wan
Attorney, Agent, or Firm—A.W. Karambelas; Kenneth W. Float

[57] ABSTRACT

We disclose and claim a novel high efficiency oscillator circuit and method of operation wherein output signal distortion is minimized by applying the weighted sum of currents flowing in an input complementary transistor pair to each transistor in an output complementary pair. This operation is accomplished using a novel summing current mirror stage to interconnect the input and output complementary pairs, and the channel width-to-length, W/L, ratios of transistors in the mirror stage sets the value of the weighted sum of currents applied to the complementary pair output stage.

6 Claims, 2 Drawing Figures

HIGH EFFICIENCY OSCILLATOR OUTPUT STAGE AND METHOD OF OPERATION

BACKGROUND OF THE INVENTION

1. Field of the Invention

This invention relates generally to low current, integrated circuit (IC) oscillators, and more particularly to a high efficiency oscillator circuit especially suited for operation in electronic watches.

2. Description of Related Art

Integrated circuit oscillators for use in electronic watches will frequently include a complementary (P type and N type) transistor pair input stage connected to a quartz crystal which determines circuit oscillation frequency. In order to provide a suitable level of output driving signal, this input complementary transistor pair will normally be connected to an output complementary transistor pair which is switched on and off at the crystal frequency to provide an AC rectangular wave output signal. This signal is then divided in frequency by a desired amount and used for driving the display of an electronic watch. Such an oscillator circuit is described, for example, in our U.S. pat. No. 4,360,789, assigned to the present assignee.

Using the above type of watch oscillator circuit, it has been found that parasitic current leakage paths in the input stage of the oscillator, and caused for example by moisture, will upset the balance of current in this input stage. in the absence of such parasitic current leakage paths, the current flow in each transistor of the input transistor pair will be equal. However, when these leakage paths are present and when DC coupling is used between the input and output stages, this current imbalance in the input stage is reflected in the output stage where it can produce unacceptable distortion in the AC waveform of the output stage.

In order to isolate the complementary-pair output stage from the above-described current imbalance of the input stage, one approach has been to use AC coupling between the input and output stages, and such an approach is disclosed, for example, by Vittoz in U.S. Pat. No. 4,013,797. However, when AC coupling is used to overcome the above problem of current imbalance and asymmetry in the input stage, a separate bias current generator is required for the output stage. This bias current generator produces a constant and undesirable DC power drain on the oscillator circuit, and this power drain is aggravated by the inability to provide suitably highvalued resistors in the bias current generator portion of the integrated circuit oscillator.

THE INVENTION

The general purpose of the present invention is to provide a new and improved integrated circuit oscillator which solves the above problem of current imbalance in the oscillator circuit without resorting to the use of a bias current generator and the undesirable power drain associated therewith. To accomplish this purpose, we have discovered and developed a new and improved high efficiency oscillator circuit, including a novel summing current mirror structure which is connected between the input and output stages of the oscillator. This novel current mirror stage maintains current balance in the output stage of the circuit even though the current balance in the input stage may be upset by the above parasitic leakage current paths.

In a preferred circuit embodiment of our invention, this summing current mirror stage is DC coupled between an input complementary transistor pair and an output complementary transistor pair which generates a driving rectangular wave signal for a given load, such as a digital watch display. The input transistor complementary pair is connected in a conventional manner to a quartz crystal which will have a natural resonant frequency of oscillation of typically 32 kHz.

The summing current mirror stage includes an input transistor pair consisting of first and second P type transistors with a common gate connection and first and second N type transistors with a common gate connection. The outputs of the first ones of these P and N type transistors are cross-connected respectively to the N and P type output transistors in the complementary output stage. Similarly, the outputs of the second ones of the P and N type transistors are cross-coupled to intermediate mirror transistor pairs, each of which have commonly connected P or N transistor gate electrode connections.

The summing current mirror stage further includes P and N type output current mirror driver transistors which are interconnected respectively between the outputs of the intermediate mirror transistor pairs and the P and N type transistors in the complementary output stage. Thus, the summing current mirror stage includes five P type transistors and five N type transistors which are cross-connected between the input complementary transistor pair and the output complementary trsnsistor pair in a manner to be further described. These devices ar operable in a current balancing mode which ensures that the currents in each transistor of the output complementary pair will be equal and will increase in proportion to the sum of the currents in the input transistor pair.

Accordingly, it is an object of the present invention to provide a new and improved oscillator circuit of the type described which operates with low current imbalance in its output stage.

Another object of the invention is to provide an integrated circuit watch oscillator which requires no separate current generators to accomplish the above current balance and thus operates at a high efficiency.

These and other objects and novel features of this invention will become more readily apparent in the following description of the accompanying drawings wherein:

DETAILED DESCRIPTION OF THE INVENTION

Figure 1:
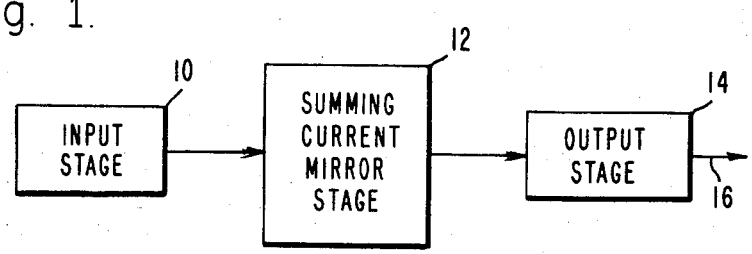
FIG. 1 is a block diagram of the tandem connected input stage, the summing current mirror stage, and output stage according to the invention.
Figure 2:
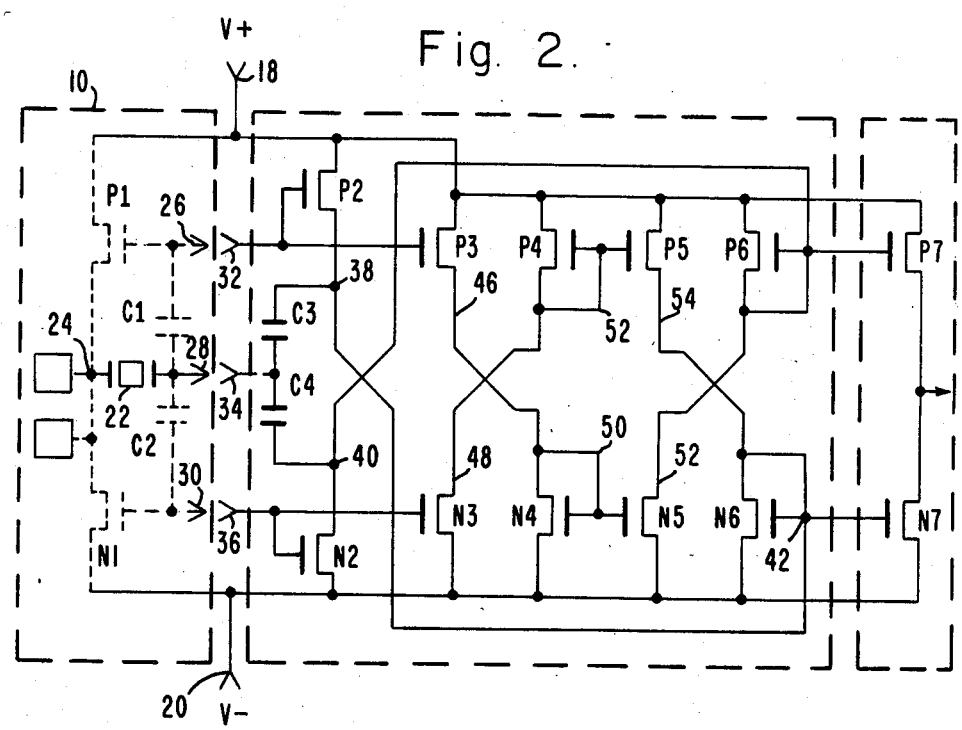
FIG. 2 is a circuit diagram which shows the interconnections between the various transistors, capacitors and crystal forming the oscillator circuit to be further described.

Referring now to FIGS. 1 and 2 wherein like reference numerals designate corresponding stages in the two figures, a transistor complementary pair input stage 10 is connected to the current mirror stage 12 including the ten metal-oxide-semiconductor (MOS) field-effect transistors (MOSFETs) identified generally above. The current mirror stage 12 is, in turn, connected to the transistor pair complementary output stage 14 having an output terminal 16 from which a square wave output signal may be derived.

The oscillator input stage 10 inlcudes a P channel field effect transistor (FET) P1 and an N channel field effect transistor N1 serially connected as shown between a V+ power supply terminal 18 and a V− power supply terminal 20. A quartz crystall 22 is connected as shown to a common junction 24 for the two transistors P1 and N1, and integrated circuit capacitors C1 and C2 provide the coupling capacitance between one side of the crystal 22 and the gate or control electrodes of the two transistors P1 and N1 respectively.

The three output terminals 26, 28, 30 of the input stage 10 are connectd as shown to the corresponding input terminals 32, 34, 36 of the summing current mirror stage 12. This stage 12 includes integrated circuit capacitors C3, C4 which are connected between the drains 38 and 40 of transistors P2 and N2 and the input terminal 34.

The summing current mirror stage 12 includes a P type input transistor pair P2, P3 having a common gate electrode connection at terminal 32 and a N type input transistor pair N2, N3 also having a common gate electrode connection at terminal 36. The drain electrodes 38, 40 of the first transistors P2, N2 of the input pair are cross-connected as shown to the gate electrodes 42, 44 of the output complementary transistor pair P7, N7 to be further described. Additionally, the drain electrodes 46, 48 of the second transistors P3, N3 of the inputs pairs are cross-connected as shown to the common gate nodes 50, 52 of the intermediate mirror transistor pairs N4, N5 and P4, P5, respectively.

The drain electrodes 54, 56 of the transistors P5, N5 are, in turn, cross-connected as shown to the drain elecrodes of the output current mirror driver transistors N6, P6, respectively. These driver transistors N6, P6 have their drain electrodes, in turn, connected to the common nodes 42, 44, respectively, to which the gate electrodes for the output transistors N7, P7 are also connected.

OPERATION

The input devices P1, N1 are the complementary input transistors of a prior art Pierce oscillator of the type disclosed in our U.S. Pat. No. 4,360,789. In normal operation, the currents through the devices P1 and N1 are equal. Since devices P2 and P3 operate at the same gate voltage as P1, then the currents of P2 and P3 will be smaller than the current flowing in device P1 by an amount approximately equal to the width-over-length (W/L) ratio of these devices divided by the W/L ratio of P1. The same is true for devices N2 and N3 with respect to input device N1.

The drain of the output mirror driver transistor P6 receives the sum of the drain currents from devices N2 and P3, and the latter is routed through the intermediate mirror devices N4 and N5. The same is true for the current received by the N output mirror driver device N6 with respect to the currents in devices P2 and N3, whose drain currents are routed through the intermediate mirror devices P4 and P5. Since the ratio of the P6 and P7 currents is designed to be the same as the ratio of the N6 and N7 currents, it follows then that the P7 and N7 currents will be equal if the ratios of currents of P1/P2 or P3 and N1/N2 or N3 are equal. Furthermore, the P7 and N7 currents will remain equal even though the P1 and N1 currents become unequal as a result of parasitic current leakage from terminal 24 to either the positive or negative supply voltage V+ or V−.

The equal currents in devices N7 and P7 will increase in proportion to the sum of the P1 and N1 currents as a result of the ratios previously described. Since the total N1 and P1 current increases slightly in response to parasitic leakage from terminal 24, it follows then that the N7 and P7 currents will increase and, as previously described, remain in balance with further increases or decreases in parasitic leakage current.

The AC signal amplitude coupled to the gates 42, 44 of devices P7 and N7 by capacitors C3 and C4 will be the same provided that capacitors C3 and C4 are sized for equal capacitive divider ratios. This sizing is accomplished with the capacitor and device typical values given in Table I below. The ratios given are the width-to-length ratio of the source-to-drain channel of each N and P type MOSFET, and the capacitance values are in picofarads. By way of example in the table below, the notation ¼×16/7 means four (4) devices with W=16 μm, L=7 μm in series. The notation 2×25/7 means 2 devices with W=25 μm, L=7 μm in parallel.

TABLE I

| Component | Ratio or Value |
| --- | --- |
| P1 | 2 × 68/7 |
| P2 | 1/4 × 16/7 |
| P3 | 1/4 × 16/7 |
| P4 | 10/9 |
| P5 | 10/9 |
| P6 | 1/4 × 16/5 |
| P7 | 2 × 113/5 |
| N1 | 2 × 25/7 |
| N2 | 1/4 × 7/7 |
| N3 | 1/4 × 7/7 |
| N4 | 10/8 |
| N5 | 10/8 |
| N6 | 1/4 × 7/5 |
| N7 | 2 × 40/5 |
| C1 | 8.7 pfd |
| C2 | 4.0 pfd |
| C3 | 4.0 pfd |
| C4 | 2.0 pfd |

The present invention is not limited to the specifically described circuit embodiment of FIG. 2, and obviously covers circuit variations and modifications within the scope of the appended claims. For example, it is not necessary that the absolute sum of P1 and N1 input currents be applied to the output transistors N7, but rather a weighted sum or fraction of currents may be applied to these latter devices by varying the W/L ratios given in the Table I above.

What is claimed is:

1. A high efficiency oscillator circuit including:
   (a) an input transistor pair serially connected via a common node which is coupled to a quartz crystal for oscillating at the resonant frequency of the crystal;
   (b) an output current mirror driver connected to an output stage and operative for producing an output signal at the frequency of the crystal; and
   (c) an intermediate current mirror stage cross-connected between said input transistor pair and said output current mirror driver for applying currents proportional to the sum or weighted sum of the currents flowing in each transistor of said input transistor pair to said output current mirror driver, whereby current imbalances in said input transistor pair are not reflected in the substantially equal and balanced currents flowing in said output current mirror driver and said output stage thereby minimizing distortion in the output signal from said output stage.

2. A high efficiency oscillator circuit including:
(a) an input transistor pair serially connected via a common node which is coupled to a quartz crystal for oscillating at the resonant frequency of the crystal;
(b) an output transistor pair operative for producing an output driving signal at the frequency of the crystal; and
(c) summing means connected between said input and output transistor pairs for applying the sum or weighted sum of the currents flowing in each transistor of said input transistor pair to each transistor of said output transistor pair, whereby current imbalances in said input transistor pair are not reflected in the substantially equal and balanced currents flowing in said output transistor pair, thereby minimizing distortion in the output signal from said output transistor pair.

3. The circuit defined in claim 2 wherein said summing means includes a summing current mirror stage having transistors cross-connected between said input and output transistor pairs, with each transistor in said mirror stage having a predetermined channel width-to-channel length W/L, ratio to set the value of the weighted sum of currents applied to each transistor in said output transistor pair.

4. An oscillator circuit comprising:
an input transistor pair serially connected via a common node which is coupled to a quartz crystal for oscillating at the resonant frequency of the crystal;
an output transistor pair serially coupled to a common node which forms an output stage of said circuit; and
a summing circuit mirror stage comprising an output current mirror driver connected to said output stage and operative for producing an output signal at the frequency of the crystal, and an intermediate current mirror stage cross-connected between said input transistor pair and said output current mirror driver for applying currents proportional to the sum or weighted sum of the currents flowing in each transistor of said input transistor pair to said output current mirror driver;
said summing current mirror causing the current in said output stage to remain balanced despite current imbalances in said input transistor pair.

5. A method for reducing distortion in oscillator output circuits having input transistor pairs subject to current imbalance driving output transistor pairs, which includes:
applying the weighted sum of currents flowing in said input transistor pair to each transistor of said output transistor pair, whereby current imbalance in said input transistor pair is not reflected in the output signal from said output transistor pair, and distortion in said output signal is minimized.

6. The method defined in claim 5 wherein the value of the weighted sum of currents applied to said output transistor pair is controlled by the selection of the channel width-to-channel length, W/L, ratios of cross-connected transistors coupled between said input and output transistor pairs.

* * * * *